United States Patent [19]
Tinney

[11] Patent Number: 6,034,883
[45] Date of Patent: Mar. 7, 2000

[54] SOLID STATE DIRECTOR FOR BEAMS

[76] Inventor: Charles E. Tinney, 9915 S. Hwy. 165, Paradise, Utah 84328

[21] Appl. No.: 09/015,536

[22] Filed: Jan. 29, 1998

[51] Int. Cl.⁷ .................................................. G11C 13/00
[52] U.S. Cl. .......................... 365/106; 365/121; 365/215; 257/428
[58] Field of Search ........................... 257/428; 365/121, 365/215, 106

[56] References Cited

U.S. PATENT DOCUMENTS

| | | | |
|---|---|---|---|
| 4,084,188 | 4/1978 | Gorog et al. | 358/199 |
| 4,143,948 | 3/1979 | McNaney | 350/358 |
| 4,386,827 | 6/1983 | Scifres et al. | 350/356 |
| 4,389,093 | 6/1983 | Jackson | 350/162.14 |
| 4,585,301 | 4/1986 | Bialkowski | 350/96.2 |
| 4,869,579 | 9/1989 | Fischer et al. | 350/354 |
| 4,880,296 | 11/1989 | Ditman, Jr. | 350/254 |
| 4,930,853 | 6/1990 | Grego | 350/96.14 |
| 4,937,539 | 6/1990 | Grinberg et al. | 330/4.3 |
| 4,966,443 | 10/1990 | Hiiro | 350/354 |
| 5,055,770 | 10/1991 | Takahashi et al. | 324/96 |
| 5,061,048 | 10/1991 | Hayden et al. | 359/315 |
| 5,093,747 | 3/1992 | Dorschner | 359/316 |
| 5,121,247 | 6/1992 | Fujita | 359/298 |
| 5,122,894 | 6/1992 | Grantham | 359/245 |
| 5,159,351 | 10/1992 | Hotomi et al. | 346/108 |
| 5,175,642 | 12/1992 | Funato | 359/298 |

(List continued on next page.)

OTHER PUBLICATIONS

Sheem, Sang, "Five Year Plan for Fast Microwave Transient Recorder Using Electro–Optics," Applied Technology Section, University of California, pp. 1–21. (Mar. 1, 1991).

Jelsma, L. F., Update on Progress Toward a Crystal Streak Camera Using New Materials, CRL–96281 Preprint, Lawrence Livermore National Laboratory, pp. 1–4, (Jun. 8, 1987).

"Wavelength Deflection Technique for High–Speed Diagnostics," Engineering Research, pp. 10–17 (Nov. 1989).

"Lawrence Livermore Micro–Technology Center," Lawrence Livermore National Laboratory, pp. 1–16 (date unknown).

King, Joseph S., "Seeing in 2D," Retail Systems Reseller, pp. 48, 50 and 51 (May 1996).

Bains, Sunny, "Computing 2000, A View to Remember," OEM Magazine, pp. 92–93, (Dec./Jan. 1996).

J.C. Koo, "Lithium Niobate Crystal Streak Camera," Engineering Research Division, Electronics Engineering, pp. 3–16, 3–17 and 3–18 (date unknown).

*Primary Examiner*—Huan Hoang
*Attorney, Agent, or Firm*—Townsend and Townsend and Crew LLP

[57] ABSTRACT

An apparatus and method for electro-optically controlling the path of a laser beam or other electromagnetic beam in a suitable spectrum (e.g. visible, infrared, etc.) operates entirely in a solid state. Crystalline carbon-60 is manufactured in a gaseous environment to produce carbon-60 balls, each capturing a polarized molecule or ion susceptible to application of an electric field. Carbon-60 balls are suspended in a matrix of transparent gel, cured polymer, or held by their own solid, crystalline structure. Electrodes for controlling electric fields imposed upon the head, preferably shaped as a semi-spherical object, may be energized by alternating voltage to provide an alternating field. The ions or polarized molecules may oscillate within the carbon-60 "cages" in any direction as dictated by multiple, phased, field electrodes. A virtual plane of ions creates a refractive environment that can selectively aim an incoming beam in accordance with oscillating patterns of ions under the influence of the electrical fields. Orthogonal fields may provide precise refraction and aiming of an electromagnetic (e.g. light) beam in two dimensions. A target material may be any electro-optical surface, or a work piece. As a memory device, the light source, directing head, and memory medium are all solid state devices requiring no mechanically accelerated parts. Storage density may be redily increased by one to three orders of magnitude. Speed increases may range from three to six orders of magnitude improvement over conventional, prior art devices.

16 Claims, 8 Drawing Sheets

U.S. PATENT DOCUMENTS

| | | | |
|---|---|---|---|
| 5,189,287 | 2/1993 | Parienti | 235/375 |
| 5,212,583 | 5/1993 | Vali et al. | 359/245 |
| 5,299,054 | 3/1994 | Geiger | 359/251 |
| 5,304,803 | 4/1994 | Sakaino et al. | 250/332 |
| 5,311,474 | 5/1994 | Urban | 365/215 |
| 5,360,973 | 11/1994 | Webb | 257/428 X |
| 5,668,657 | 9/1997 | Talbot | 350/315 |

SOLID STATE DIRECTOR FOR BEAMS

BACKGROUND

1. The Field of the Invention

This invention relates to memory devices and, more particularly, to novel systems and methods for directing a light beam to read and write from a medium for storing information.

2. The Background Art

Memory devices have existed to support computers since computation was invented. Memory devices for modern computer systems meet physical limitations controlling the ability to write data, read data, and to reliably store data. In more recent years, electromagnetic media have been augmented, sometimes replaced, by optical media. For example compact disk read only memory (CD ROM) has become a major distribution medium for software, data, reference materials, images, art works, music, and the like. As a practical manner, the total available number of bits that may be stored in a CD ROM or any optical or electromagnetic memory device is limited by its "resolution." Various physical and electrical factors contribute to limitations on resolution.

An ability to direct a writing device, direct a reading device, prevent interaction between bits, and the like have limited density of media recording data. Moreover, fundamental mechanical limitations exist for reading heads and writing heads in memory devices. The quality of signal processing and available limitations on speed have together combined to produce the information storage technologies used in the prior art.

The density of data on an actual storage medium is important. Also, the overall density of data for the entire storage medium and its supporting infrastructure may be very significant. Memory density may be thought of as the inverse of resolution. For example, the number of bits that may be stored in any medium of a particular size, such as an area or a volume, may characterize a storage density as that number of bits per that particular volume, area, or other resource measurement.

In modern memory systems, particularly non-volatile ones, such as hard drives, floppy diskettes, Bernoulli drives, electro-optical disks, CD ROM's, and the like, have relied on certain moving mechanical parts. Typically, a storage medium is configured in a circular format to be rotated. Meanwhile, a mechanical head may traverse radially over the rotating medium. Thus, electronic control of starting and stopping of reading may selectively read or write along an arcuate path over a medium. The rotating speed of a medium, coupled with the speed of the electronic switching to begin or end reading or writing, and the mechanical accelerations available for moving the head radially have traditionally controlled the speed, resolution, and densities of memory devices.

The memory devices available in the prior art are positioned in many locations with respect to the actual processors using or creating data stored therein. For example, a computer may have a level I cache. The level I cache is typically located immediately on the computer chip that holds the processor itself. Other caches may be located more remotely. For example, other caches may be located across the computer bus on a motherboard or other highly integrated portion of a computer close to the central processing unit (CPU).

Random access memory may be located even more remotely from the CPU than is the cache. Random access memory may be located in a chip on the mother board of a computer and connected by the main computer bus thereon. Hard disks, floppy diskette, and the like, along with optical CD ROM readers, and CD ROM writers, may be connected to a computer as peripheral devices.

Much of computer architecture is driven by the sizes of components. Moreover, the speed of access to memory devices is often critical. Thus, a CPU does not access the hard drive for data or other data structures (e.g. applications or other executables) if the required data structures may be stored to be accessible in the random access memory (RAM). Similarly, an executable line of code that may be stored in a cache will be found there first, if available. Thus, a CPU seeks to find data structures required for operation in the closest, fastest, available location. Architectures of all operating systems are crafted to manage information in the caches, RAM, and storage (e.g. ROM, CD ROM, hard drive, floppy drive, etc.).

Thus, computer speed is limited by the proximity and availability of data or data structures, whether executables or simply operational data. Making more memory available in a smaller envelope (total size) permits a memory device to be located closer to the CPU in terms of access speed. Minimizing mechanical parts speeds the accessability to data in a memory device.

Not only do moving mechanical parts take relatively large space with respect to a CPU, but they generate heat and shock loads that may harm integrated compounds. Also, mechanical devices use substantial electrical energy. Large users of electrical energy may affect the voltages, inductance and, generally, the conditioning of available voltages and currents used in electronic circuits. Thus, mechanical devices are typically located remotely from less robust, electronic components operating at more stable voltages and lower currents.

Mechanical parts wear. Tolerances change. Time, temperature, wear, and abuse change their physical operation. Newton's second law of motion still limits their theoretical, maximum, response speed.

Thus, what are needed are increased storage densities for memory, and a reduction of mechanical parts. What is needed is increased memory resolution and density at increased operational speed. Preferably, memory is needed that can be available in a solid state. Storage of data in an envelope of reduced size, at an access speed corresponding to the speeds of electrons and light rather than mechanical responses, may provide improved memory support for increasingly large applications and other executables.

In addition, laser technology and other electromagnetic radiation beam technologies are being applied in varied ways. In general, directing a beam, such as a laser beam, more rapidly, with higher resolution, may be used in applications as diverse as surgery, holographic displays and readers, oscilloscopes, switches, and logical devices. Thus, any available use of lasers, electromagnetic radiation, light, and the like may benefit from higher speed in direction, and increased resolution thereof. High speed and precision pointing are required.

BRIEF SUMMARY AND OBJECTS OF THE INVENTION

In view of the foregoing, it is a primary object of the present invention to provide a solid-state director for electromagnetic radiation, specifically light beams, such as lasers and the like.

It is another object of the invention to provide a head for directing a beam, using only solid state materials, and relying on no mechanical motion or acceleration.

It is another object of the invention to provide a high density memory device addressable in at least two dimensions by a beam of electromagnetic radiation in a spectrum associated with infrared, visible, or other light wavelength useful for transmitting information.

It is another object of the invention to provide an electric field as a rapid control for direction of an electromagnetic beam.

It is another object of the invention to provide a low inductance for maximum speed, coupled with reduced mechanical inertia by removing moving mechanical parts, above an atomic level of motion, for directing a beam, such as a beam of light.

It is another object of the invention to provide a mechanism for capturing ions or molecules responsive to an electric field in order to manipulate an index of refraction of a material in a head directing a beam.

It is another object of the invention to provide a Fullerene molecule as a cage for an ion or polarized molecule responsive to an electric field, in order to change an index of refraction of a solid state head passing a beam therethrough toward a target, from a beam source.

It is another object of the invention to provide a light source directed in two dimensions through a solid state head to a 2-dimensional target surface, and a receiver for accepting back a reflection of the beam through the same head, in order to provide high resolution, high speed, and high density in a memory device.

It is another object of the invention to provide a generalized beam controller for controlling light beams for electromagnetic frequencies appropriate to being directed in one or more dimensions and specifically in two dimensions.

Consistent with the foregoing objects, and in accordance with the invention as embodied and broadly described herein, a beam director is disclosed in one embodiment of the present invention as including a head containing polyhedral molecules of carbon, commonly known as Buckminster Fullerene, each molecule capturing therein an ion or polarized molecule of a material selected to refract a beam.

The Fullerene may be imbedded in a gel, or a transparent polymer in a desired shape. In one embodiment, a hemisphere may be formed to have a matrix of optically transparent material, transparent in the wavelength of the beam of interest. Polyhedral "balls" of Fullerene are packed into the matrix, which matrix may be either a gel or a cured, solid polymer.

In one embodiment, the spherical (e.g hemisphere) head may be made entirely of solid Fullerene. That is, carbon-60 may actually be formed as a solid crystal structure with no intervening or interstitial matrix. The Fullerene may be formulated in the presence of a gas, preferably of sufficiently high density in the gas or vapor will assure that each Fullerene molecule holds an interstitial ion or molecule of a selected gas with a crystalline carbon cage.

The head is subjected to one or more electric fields. An alternating electric field is preferable. Thus, the head is composed of a large number of Fullerene cages or balls, each containing a selectively vibrating ion or polarized molecule oscillating at field frequency ion or polarized molecule. An electric field may be applied in any direction across the head. Multiple electric fields may be applied in multiple orthogonal directions.

Application of one or more electric fields may cause creation of a virtual plane of vibrating or oscillating gas particles (e.g. ions, molecules, etc.) along a field axis between the field electrodes. In one embodiment, an alternating current electric field may be applied along several orthogonal axes passing through the head, sufficient to define any direction. Accordingly, upon activation of field electrodes, the captured ion (e.g. gas, polarized molecule, or the like) may alternately, at the field of frequency, move toward and away from each field electrode in turn within a probabilistic plane of motion. The speed or frequency of the alternating field may be selected according to various designed criteria. The response of the ions will thus control and effect the response direction of the incident beam.

Thus, an apparatus and method in accordance with the invention may rely on creation of carbon-60 molecules, each comprised of 60 carbon atoms arranged in a spherical structure of hexagons and pentagons formed by bonded atoms. An ion or polarized molecule is captured within each carbon-60 molecule. An envelope, whether defining a solid structure, an optically transparent shell encasing a gel matrix, or the like, is provided. The envelope is filled with the carbon-60 molecules, which may or may not be filled with a matrix of another material. A hemispherical surface provides the path for the transmission of light by equalizing the path, regardless of direction for outgoing, refracted beams while presenting a surface normal to any returning beam, reflected from a target.

The flat surface on a hemisphere may receive a beam from a beam source. The incoming beam will be refracted by a semi-spherical directing head to a target. The beam may be directed by submitting the ion or polarized molecules (captured in the carbon-60 molecules of the heads) by an electric field. Multiple electric fields may provide virtual planes of alternating ion motion, in accordance with alternating electric field between field electrodes. The oscillating or vibrating ions, oscillating at the frequency of the voltage source activating the electrodes, improves the probability that an incoming light ray will encounter an ion and be reflected or refracted at a proper, desired, designed, angle. The polarizing effect of the fields may provide a very high frequency switching ability for the direction of the virtual plane of the oscillating ions. Multiple heads can be used for logical switching as signals are relayed from one head to other heads for re-direction.

The incoming beam, from a suitable source, may be combined with a reader for reading a reflected beam, may provide light (e.g. any suitable frequency of electromagnetic radiation selected), through the optically transparent matrix to the oscillating ions (or polarized molecules) in Fullerene cages or balls. The incoming beam, may be thus refracted, as documented in physics and chemical analysis. That is, chemical refraction processes for identification for crystal lattices, is known.

The concept of a virtual plane, of ions or molecules vibrating in a probability-controlled pattern, to create a virtual plane within a crystal lattice of Buckminster Fullerene, is not known and understood in the art. Current theories on manipulation of indices of refraction focus on thermal effects. Field effects are not understood as having the ability to directly vary an index of refraction.

A plurality of electrodes, certain sets being orthogonal to certain other sets, may provide an entire, arbitrarily controllable directionality to any incoming light beam. Thus, suitable control of electrodes, in any manner known in the art, may be used to produce the virtual plane of ions. Cathode tubes (CRT) use electrodes to guide electrons along a ballistic path toward a screen. Imposing a field in that context is a well understood art. Liquid crystal displays may rely on orientations of dipoles, also. Imposing an alternating field to create a virtual plane, in accordance with the invention, may extend the use of field control of ion motion (in general any charged particle motion) to obtain a very minimal dispersion of a refracted beam. This control provides rapid, reliable, precise direction of the beam toward any suitable two dimensional surface.

Target surfaces for receiving the beam, and for reflecting the beam, may be used to write, read, or write and read out the contents of data stored on the two dimensional surface. Surfaces configured, and read/write operations, may be performed in any of several suitable manners know in the art for recording media. The two-dimensional surface, may be semi-spherical to surround the beam-directing head. In one embodiment, a hemispherical head may refract a light beam onto a flat surface there below. Alternatively, a hemispherical or semi-spherical head may refract a light beam to a semi-spherical target surface.

The overall density obtainable for reading and writing to an optical medium may be very high. Resolution may be within a few molecules, width, as the significant dimension defining the total area or diameter for each bit of information. Thus, a cube, two inches on a side, may be constructed to hold several gigabytes of data in a solid-state device.

A light may be transmitted through a solid medium, rather than simply transmitted through space and reflected off a surface mechanically aligned. In some applications, multiple beams may be provided through one or more heads, with the combination of the beams combining to act at a radius within a solid, at some azimuth and elevation. Thus, a beam-directing head may provide, for example, a stereo beam that acts only at a specific radius, azimuth, and elevation within a solid semispherical medium. Any use of light beams, in a process may be considered for direction by a head in accordance with the invention. The power and frequency or response, designed along with the spectral frequency of the head may be used for laser cutting, visible or ultraviolet curing of polymers, and other processes requiring direction of beams.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION OF THE PREFERRED EMBODIMENTS

It will be readily understood that the components of the present invention, as generally described and illustrated in the Figures herein, could be arranged and designed in a wide variety of different configurations. Thus, the following more detailed description of the embodiments of the system and method of the present invention, as represented in FIGS. 1 through 8, is not intended to limit the scope of the invention, as claimed, it is merely representative of certain presently preferred embodiments of the invention.

The presently preferred embodiments of the invention will be best understood by reference to the drawings, wherein like parts are designated by like numerals throughout. Those of ordinary skill in the art will, of course, appreciate that various modifications to the detailed schematic diagrams of FIGS. 1–8 may easily be made without departing from the essential characteristics of the invention, as described in connection therewith. Thus, the following description of the detailed schematic diagrams of FIGS. 1–8 is intended only as an example, and illustrates, certain presently preferred embodiments consistent with the invention as claimed herein.

Figure 1:
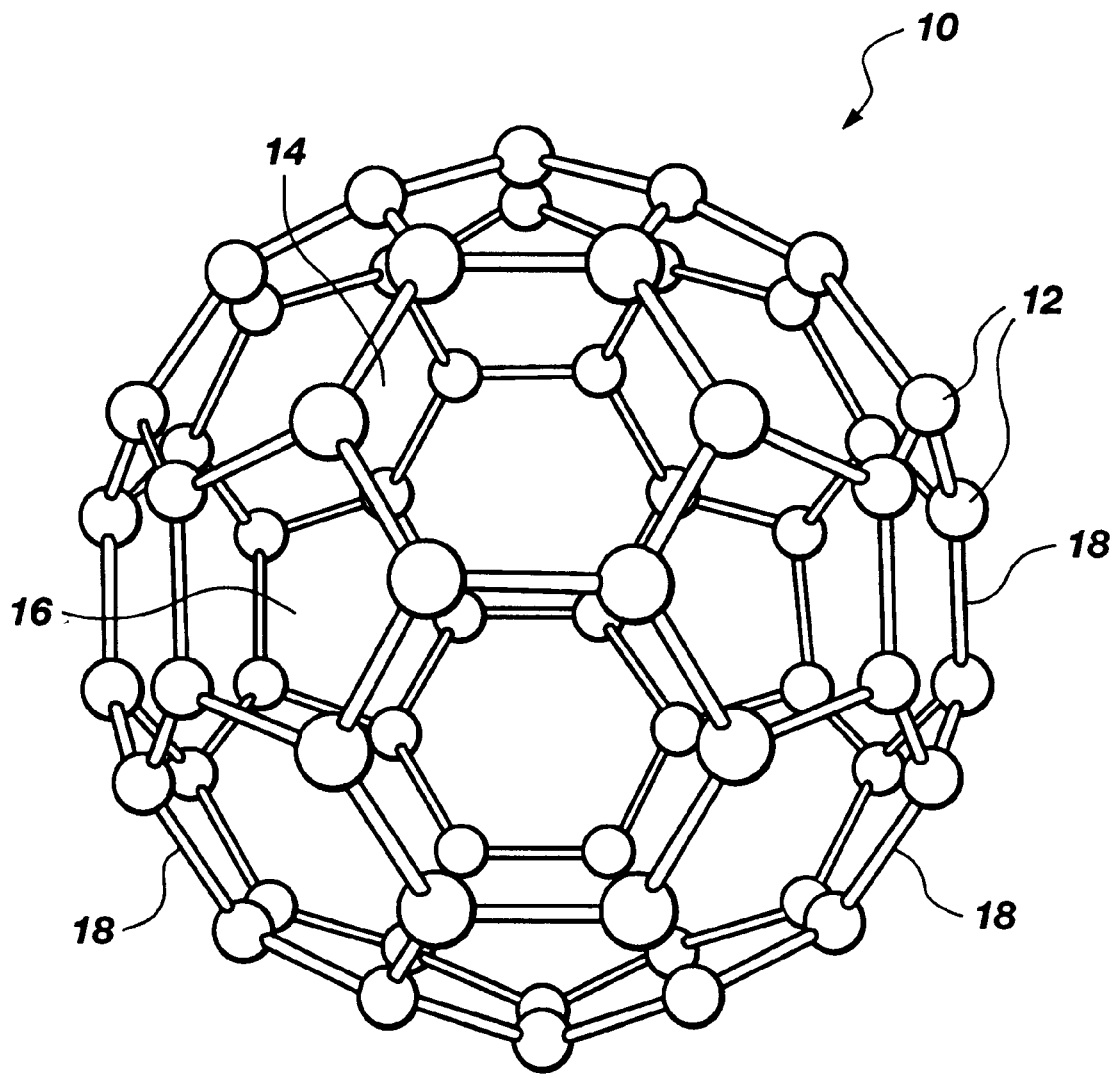
FIG. 1 is a schematic diagram of a molecule of carbon-60 suitable for implementing a method and apparatus in accordance with the invention.

Referring to FIG. 1, a carbon-60 molecule 10, contains sixty atoms 12 of carbon are bonded in hexagons 14 and pentagons 16 to form a material, commonly known as Buckminster Fullerene, or Bucky balls. Fullerenes are named for Buckminster Fuller, the legendary proponent of geodesic domes for construction, and various, non-traditional innovations. The carbon-60 forms a hollow sphere at a molecular level. The bonds 18 are formed during processing of carbon atoms 12 to make the Fullerene 10.

In one presently preferred embodiment, Fullerene molecules 10 are formed in the presence of a gas or vapor of ions or polarized molecules. For example, ions may include sodium, chlorine, water, or other common or uncommon materials. Any polarized particle subject to capture may suffice.

Accordingly, a molecule, shaped like a modern soccer ball, will contain an ion 20 within a carbon-60 molecule 10 made of twelve pentagonal faces, each surrounded by five hexagons. Twenty hexagons and twelve pentagons, evenly distributed, form a cage for an ion 20 or polarized molecule 20.

Figure 2:
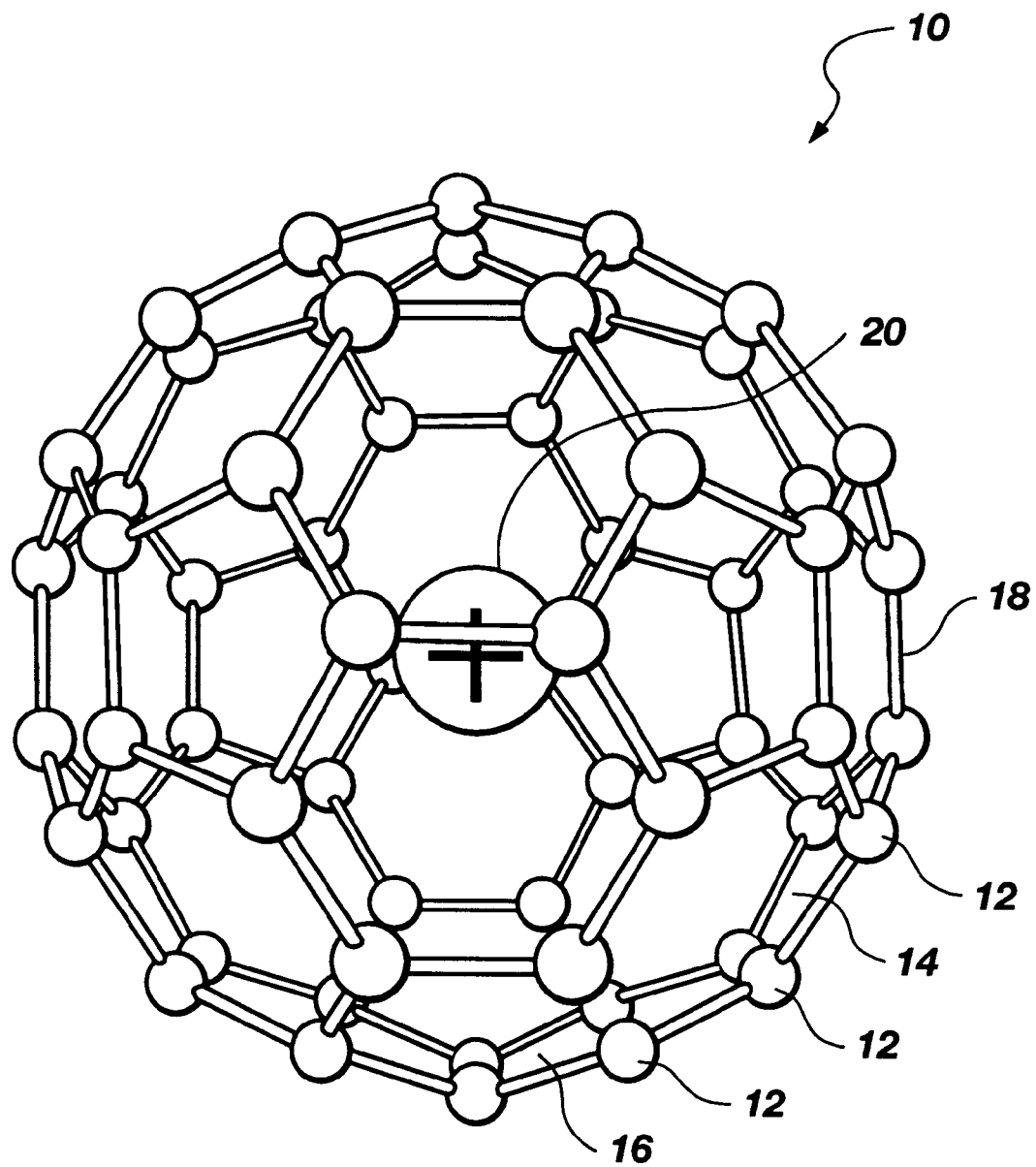
FIG. 2 is a schematic diagram of a crystalline, Buckminster Fullerene molecule of FIG. 1 containing an ion or polarized molecule trapped therein.

Referring to FIG. 2, the formation of the crystal carbon-60 molecule 10 in a gas environment, provides interstitial, captured ions 20 or polarized molecules 20, charged or otherwise susceptible to electrical fields.

Figure 3:
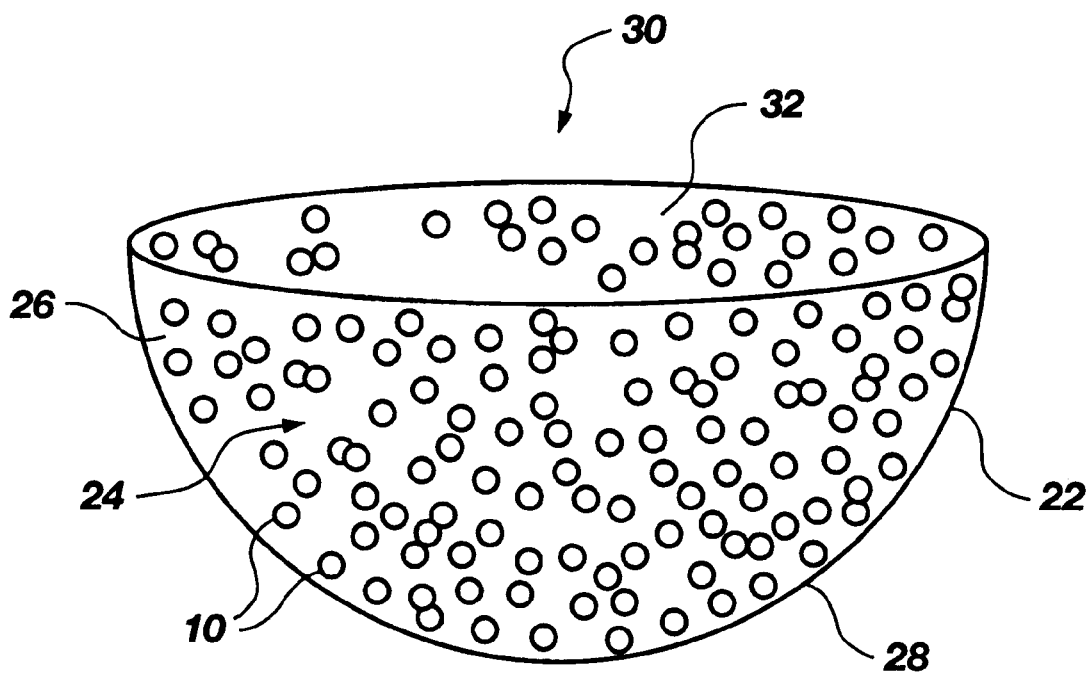
FIG. 3 is a schematic diagram of semi-spherical matrix containing numerous of the molecules of FIG. 2 in accordance with the invention.

Referring to FIG. 3, carbon-60 molecules 10, having their polarized contents captured within the respective Fullerene crystal structures, may be formed to fit within an envelope 22, such as a shell 22, or simply a dimension 22. The envelope 22 may be defined by a physical shell 22 for supporting a matrix 24, such as a gel 26 in which the carbon-60 molecules 10 are suspended. In one embodiment, the matrix 24 may be formed of a cured, optically (electromagnetically) transparent polymer. In another embodiment, solid Fullerene crystals may be created, resulting in a solid crystal lattice of carbine-60 molecules 10, each capturing a suitable ion 20 or equivalent 20.

A solid, carbon-60 crystal may require grinding or machining to form a hemispherical surface 28 or other semisphere 28. In one presently preferred embodiment, the envelope 22 may be hemispherical. Alternatively the envelope 22 may be manufactured in a nearly complete sphere. By any of the available modes, gel 26 in a shell 22, a cured, transparent, polymer matrix 24, or a solid, crystalline lattice of carbon-60 molecules 10, a head 30 may be created and shaped as desired. The head 30 may be referred to as an aiming head, a refractive head, or the like. The head 30 may operate as a beam-directing head. Accordingly, a flat surface 32 may be provided for minimizing reflections of any beam directed into the head 30.

Figure 4:
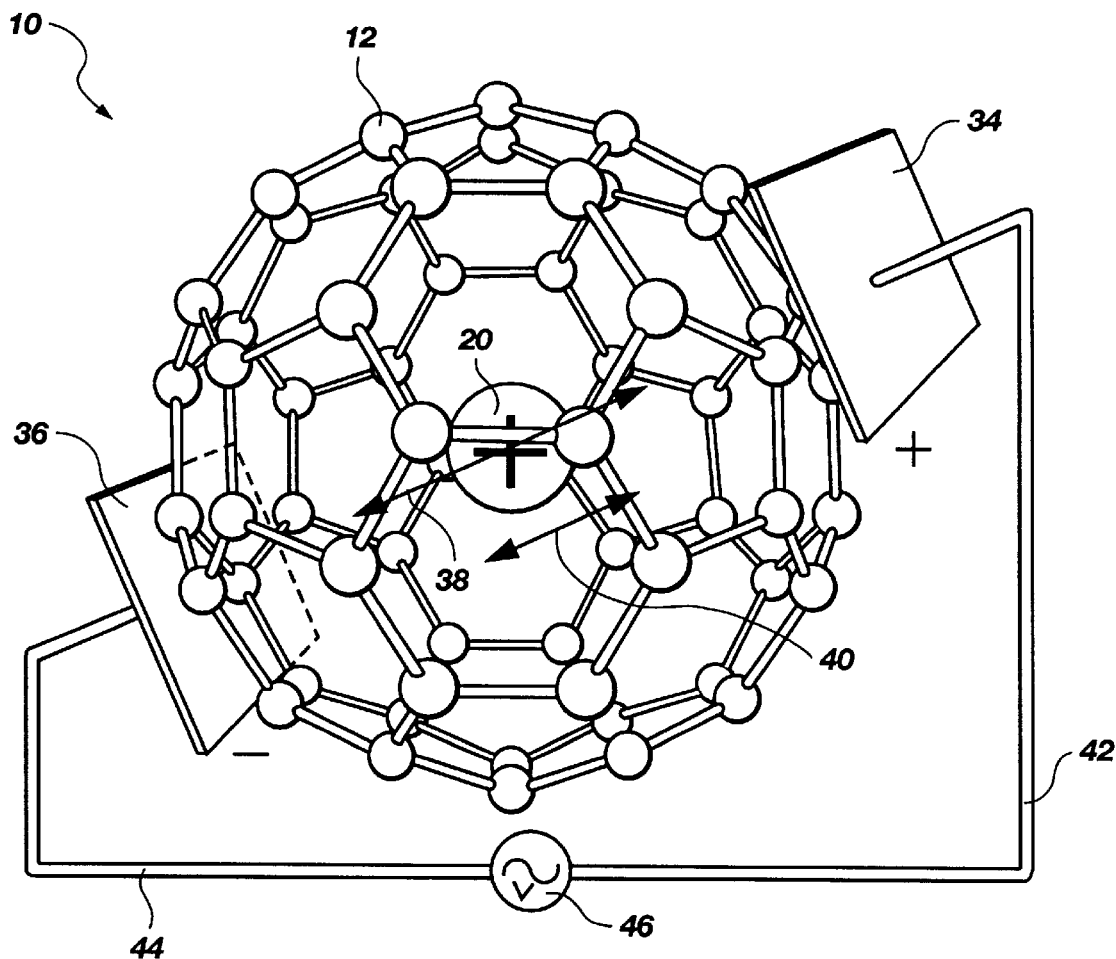
FIG. 4 is a schematic diagram of a molecule of FIG. 2 exposed to an alternating electric field for inducing and orienting an oscillation of the ion or polarized molecule in the carbon-60 crystal.

Referring to FIG. 4, electrodes 34, 36, may be formed as plates, surfaces, conductive coatings, or the like, Electrodes 34,36 may be applied to a surface 28 of a semispherical head 30. Accordingly, each individual carbon-60 molecule 10 may "see" the electrodes 34, 36 as illustrated schematically in FIG. 4. A direction 38 or motion 38 may be imposed upon the normal envelope 39 of possible motion of an ion 20. Herein, the ion 20 refers to any polarized, captured entity within the carbon-60 molecule 10 susceptible to an electrical field 40. The resulting electric field 40 will orient the ion 20.

If the field 40 is alternating, due to an alternating voltage applied to electrodes 34, 36 the motion 38 will be an oscillation of the ion 20 at the frequency of the change in the field 40. The conductors 42, 44 make connect a voltage source 46 (e.g. field source) adapted to a desired frequency selected to control the oscillation of the ions 20 and provide a suitably oriented planar molecular surface for controlling the aim of the lightbeam.

As a practical matter, the relative dimensions of the electrodes 34, 36, and the carbon-60 molecules 10 is not as shown schematically in FIG. 4. Thus, rather than an individual molecule 10 and an individual ion 20, the virtual plane of ions 20 may be present, probabilistically, as established by the field orientation between the electrodes 34, 36. The virtual plane may be though of as a probabilistic phenomenon. A high probability will exist that an ion 20 will, at any time, exist within the plane defined by the field 40.

Multiple layers of such ionic planes will actually exist if light penetrates through the theoretical plane of the motion 38, a subsequent layer may refract the beam. Thus, the individual ions 20, although presenting a probabilistic obstacle to a light beam, may present such a reliable, formidable obstacle as to effectively diffract an entire light beam to a target FIG. 5 49, a large portion of 48.

Figure 5:
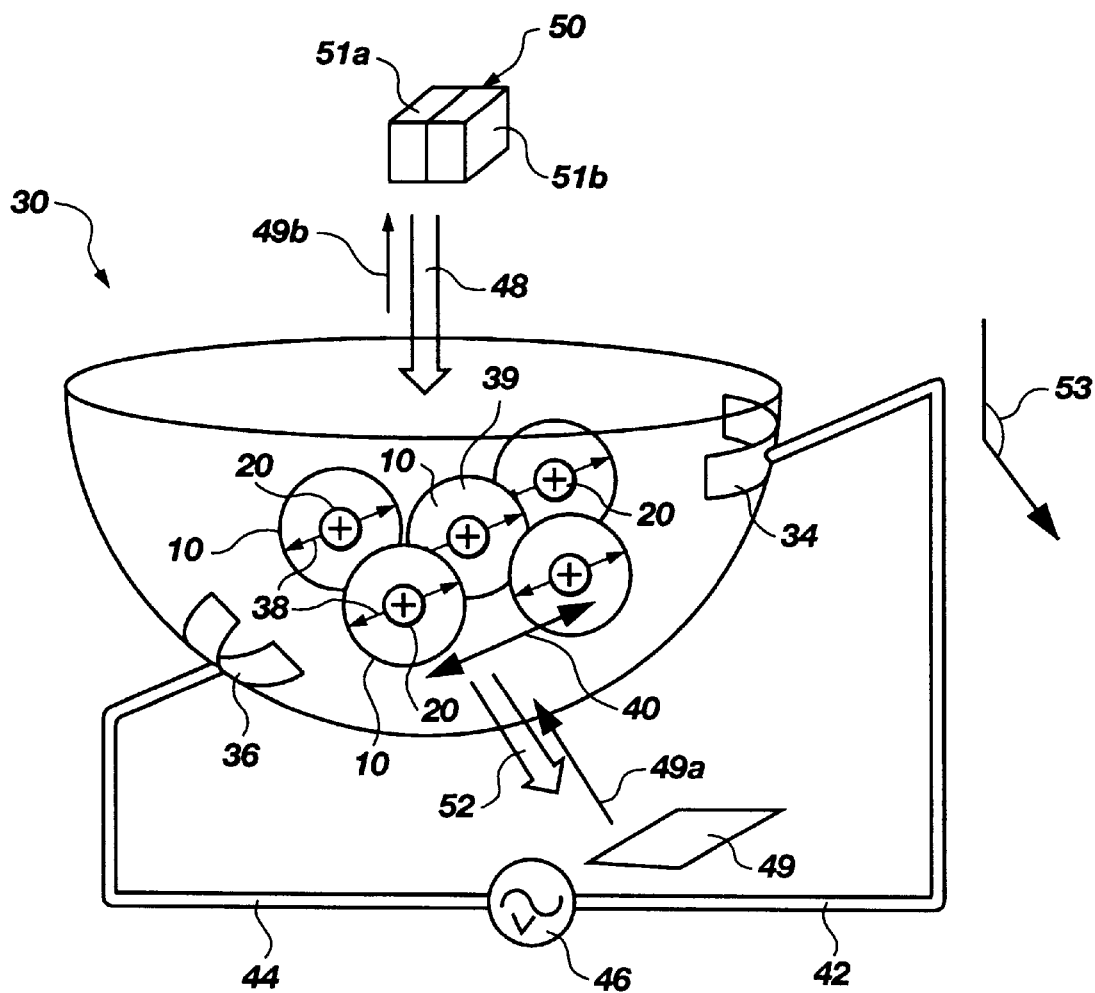
FIG. 5 is a schematic diagram of a semi-spherical, beam-directing head for receiving a light beam and refracting the light beam from a virtual plane of oriented ions or molecules in accordance with FIGS. 3–4.

Referring to FIG. 5, an incoming beam 48, desired to be directed to a target 49, may be generated by a source 50. A source 50 may contain a sender 51a and a receiver 51b for, respectively, the light beam 48 and its reflections on 49, (e.g. 49a, 49b) from a target 49. That is, in general, a beam 48 may be directed from the source 50 through the head 30 (beam-directing head 30), to exit as an outgoing beam 52 in a selected angle 53 or direction 53. The angle 53 may be defined by the virtual plane 59 (see FIG. 6) of ions 20, oriented along the field 40 between the electrodes 34, 36.

Figure 6:
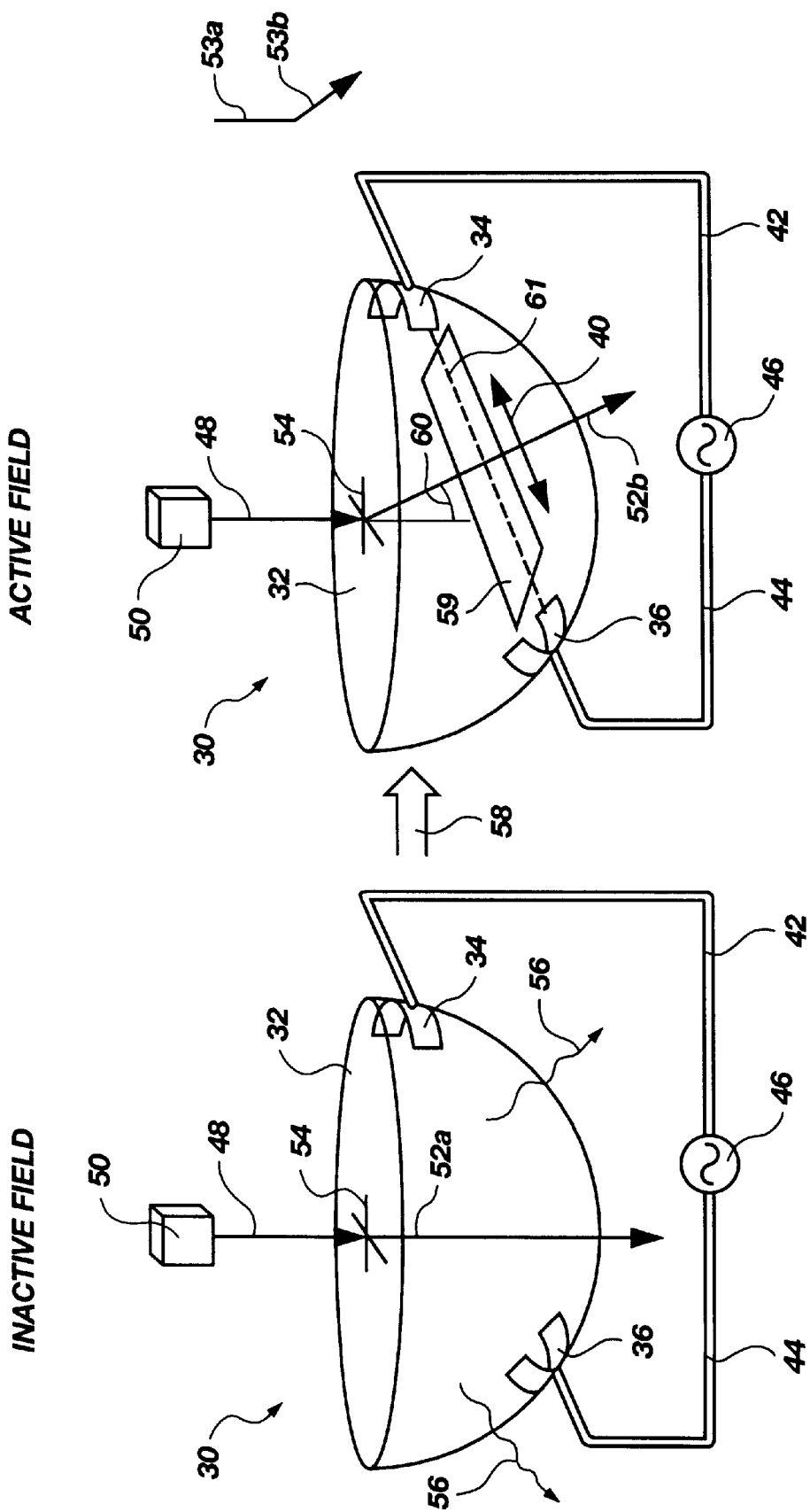
FIG. 6 is a schematic diagram of the semi-spherical head of FIG. 5 comparing a state having an inactive field, with the state of an active, alternating field for aligning motion of captured ions to refract an incoming light beam.

Referring to FIG. 6, a beam 48, directed at the center 54 of, or otherwise normal to, a flat surface 32 of a semispherical head 30 may be non-refracted or refracted at random. Refraction will occur in accordance with the molecular structures of the carbon-60 molecules and the ions 20, unaffected by a field, when the "inactive field" state exists. Scattering beams 56 may refract from the incoming beam 48, with the majority of the incoming beam 48 passing through the head 30 as an undirected beam 52a. Since no voltage is applied by the voltage source 46 through the conductors 42, 44 to the respective electrodes 34, 36, the outgoing beam 52a is uninteresting.

In an activation process 58, the voltage source 46 may apply a potential between the electrodes 34, 36, creating the field 40. The electrons or ions 20, as charged particles, would normally drift with a field 40, as illustrated by the Milliken oil-drop experiments, cathode-ray tubes, etc. However, since the ions 20 are each captured within a carbon-60 molecule 10, motion is restricted. Moreover, since the molecules 10 are captured within a matrix 24 in the head 30, the molecules cannot drift.

Since the field 40 is an alternating field, the ions 20 may oscillate in their cages 10 at the frequency of the source 46 and its created field 40. The ions 20, thus form a virtual plane 59. As a practical matter, multiple electrodes 34, 36 may be provided to assure existence the virtual plane 59. At an atomic level, the incoming beam 48, or incident beam 48 will refract at some angle 60, or refractive angel 60. The outgoing beam 52 may thus be directed normal (perpendicular) to the field 40 and the virtual plane 59. Reflected light obeys a different rule based on an angle of incidence.

The virtual plane 59 may be thought of as including an alignment axis 61 between the electrodes 34, 36 but may actually exist at many layers. Many layers of ions 20 may be subjected to the field 40. Accordingly, each layer itself is actually virtual. Each ion 20 will tend to direct incoming rays from the beam 48 from the directions 53a into the direction 53b. Of the outgoing beam 52b. Nevertheless, it is instructive to regard the entire beam 48 as behaving as a particular ray and totality of ions 20 as behaving as single plane 59.

Figure 7:
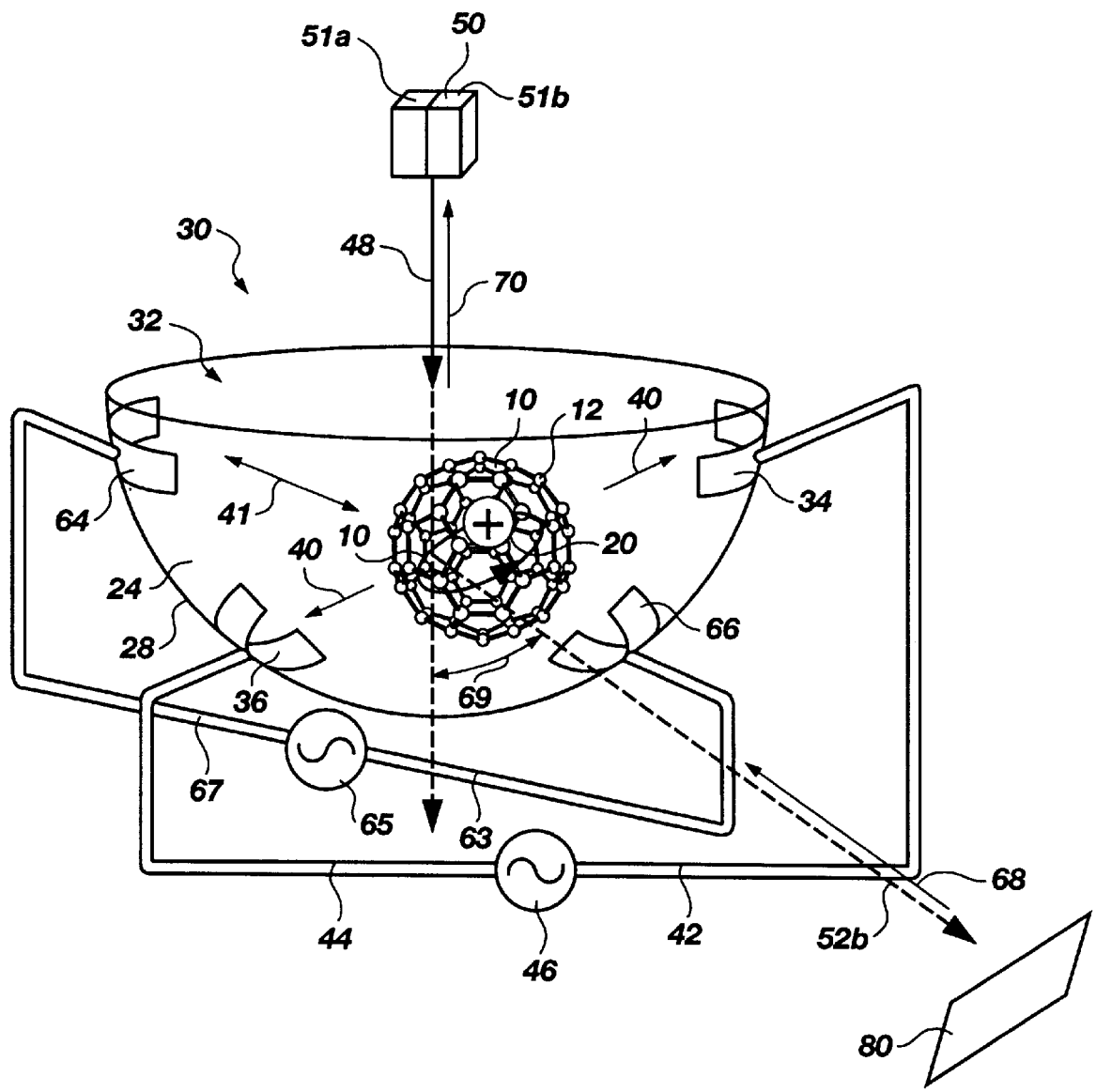
FIG. 7 is a schematic diagram of a semi-spherical head of Buckminster Fullerene crystals capturing ions that may be influenced by multiple, potentially or orthogonal, alternating fields to produce a virtual plane of refraction for an incoming light beam, as well as a reflected beam returning from a target impinged by the outgoing, refracted beam.

Referring to FIG. 7, multiple electrodes 34, 36 and 64, 66 may be installed orthogonal to one another about the head 30. As illustrated schematically, the individual carbon-60 molecules 10 exposed to the multiple electric fields 40 between the pairs 34, 36 and 64, 66 of electrodes may provide a true plane 59 of refraction. Although the exact shape of the head 30 is not overly critical, a linearly controllable configuration is desirable.

Different electrodes 34, 36, 64, 66 may be applied to provide efficient linear combination of the effects thereof. The fields 40, 41 established by the respective pairs 34, 36 and 64, 66 of electrodes may be added vectorially. The addition of all vectorial velocities of ions 20 may form virtual planes. The virtual planes can be rotated by proper application of the fields 40, 41.

Figure 8:
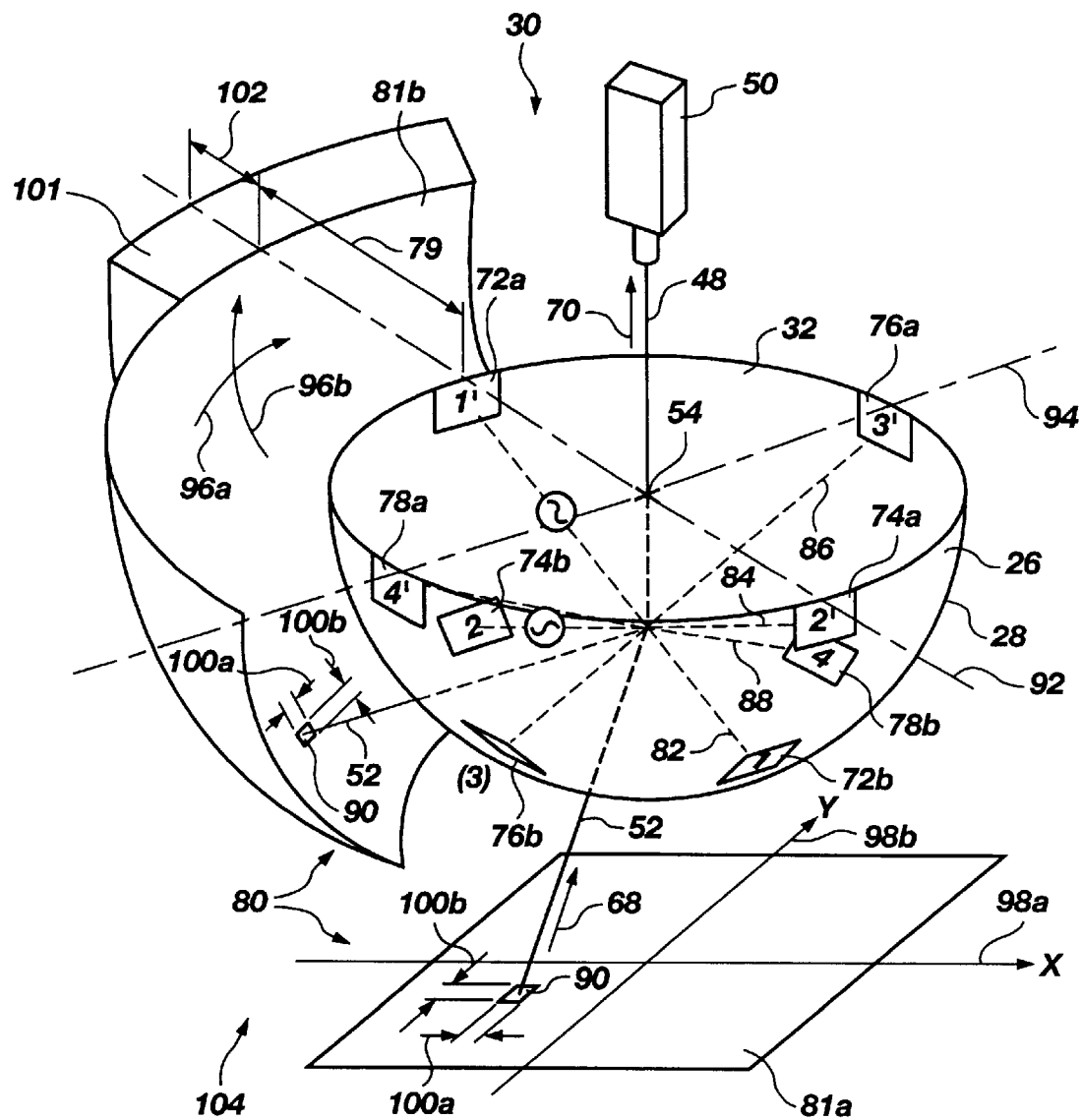
FIG. 8 is a schematic diagram of a head, in accordance with the invention, having multiple, orthogonal, virtual planes defined by multiple, alternating, electrical fields, for directing refraction of a light beam to a specific location on a 2-dimensional target surface, such as an optical memory device, or, a other solid state device.

Referring to FIGS. 6–8, multiple voltage sources 46, 65 may be applied to the respective electrodes 34, 36, 64, 66 through respective conductors 42, 44, 63, 67. In FIG. 7, two pairs of electrodes 34, 36, 64, 66 are provided. In FIG. 8, four pairs 72, 74, 76, 78 of electrodes are provided. By changing the phase and magnitude of the voltage sources 46, 65 being applied to each of the electrodes 34, 36, 64, 66, 72, 74, 76, 78 it is possible to create a rotating planar ion field 59 as a resultant. Thus, the effective incident angle 69 of the beam 52 may be altered. Note that a return beam 68 (see FIG. 7), reflected from a target 80 or surface 80 may return along the same path 52 to become the return beam 70 into the source 50 equipped with both a sender 51a and a receiver 51b.

Referring to FIG. 8, the electrodes 72a, 72b, 74a, 74b, 76a, 76b, 78a, 78b may define planar relationships with respect to one another. The head 30 may be positioned to access at some distance 79 away from the semispherical surface 28, a surface 80. For example, if the surface 80 forms a memory medium, the head 30 may refract the incoming beam 48 to target an outgoing beam 52 toward any desired position on the surface 80.

In one embodiment, the surface 80 may be a flat plane 81a. The shape of the surface 80, maybe otherwise arbitrarily designed. Alternatively, the surface 80 may be formed as a curved, even semispherical surface 81b. Across the head 30, whether or not actually placed close to the surface 28 thereof, the electrodes 72, 74, 76, 78 may provide associated, alternating fields 82, 84, 86, 88 receptively. The fields 82, 84, 86, 88 may be referred to in FIG. 8 as field axes 82, 84, 86, 88, respectively, defining the axes of orientation of fields 82, 84, 86, 88.

Within the available resolution accuracy of the head 30, with respect to the beam 48 of the source 50, individual elements 90 may be defined. Each of the elements 90 may be thought of as a smallest surface area that can effectively be addressed by the precision of the outgoing beam 52 from the head 30. The speed and accuracy with which a beam 48 may be directed through a head 30 by the electrodes 72, 74, 76, 78 in a timely fashion, defines the size of each of the elements 90.

In one embodiment, the semisphere 28 may be a hemisphere 28. Center lines 92, 94 may be represented orthogonally with respect to one another. At some distance 79 from the surface 28 of the semispherical head 30, the target 81a, 81b (or surface 81a, 81b) may be positioned to receive a directed, outgoing beam 52 (e.g. beam 52b).

In a spherical embodiment 81b, a surface 81b may be scanned in an azimuthal direction 96a, and an elevation direction 96b. In a flat surface 81a, an individual element 90 may be indexed in an X direction 98a and a Y direction 98b.

The resolution 100a in an X direction 98a or azimuthal direction 96a, and the resolution 100b, or dimension 100b in a Y direction 98b or an elevation 96b may be determined by the size, speed and accuracy of the head 30 in directing the incoming beam 48 to the respective surface 81a, 81b. The dimensions, 100a, 100b for an apparatus and method in accordance with the invention, in one embodiment are on the order of approximately three molecules in size. Thus, the storage density on a surface 81a, 81b may be increased by an order of magnitude above the storage density in currently available memory devices.

In one embodiment, a 3-dimensional solid 101 may extend a distance 102, or thickness 102. The beam 52 may be directed into the thickness 102. Multiple beams 52 may interact a specified focaldepth. For example, a holographic memory device may read and write to a particular distance 79 radially away from a surface 28 of the head 30. Likewise, interactions, between beams or combining at a location in the depth 102 of the solid 101 may be used to trigger processes for data management, chemical reaction, cutting surgery and so forth.

In one embodiment, the field of 82, 84 are used to define a plane. Similarly, the field axes 86, 88 may form a plane. Obtaining exact orthogonality between each of the pairs of electrodes 72, 74, 76, 78, may be more difficult on a surface 28 of a hemispherical head 30, than it would be if a larger portion of a sphere were used for the head 30. Field strength may need to increase to produce the same effect, if the fields electrodes 72, 74, 76, 78, are moved to a distance beyond the medium 81a, 81b.

Thus, in one presently preferred embodiment, the electrodes 72, 74, 76, 78, may be provided as coating on the surface 28 of the head 30 and provided with appropriate conductors 42, 44, 63, 67 to establish the necessary alternating fields 82, 84, 86, 88, respectively. The relative phases of the electrical fields 82–88 may cause different planar orientations of the virtual planes 59 created by the ions 20.

Accordingly, at the speed available to switch a voltage, any or all of the fields 82–88 may be altered to change the angle 69 of the outgoing beam 52b, with respect to the unaffected beam 52a of FIG. 7. Thus, the apparatus of FIG. 8 provides fully controllable refraction of an incident beam 48, such as a light beam, through a beam-directing head 30 to any location 90 on a surface 81, whether flat 81a, or spherical 81b.

As a solid state device, the head 30 and the medium 81 may form a memory device having a density for data of typically one to three orders of magnitude improvement. Similarly, speeds of change in the location 90 of the beam 52 may be increased by up to six orders of magnitude over prior art systems.

Manufacturing techniques for the head 30 may include molding a shell 22 or envelope 22 for receiving a matrix 24. The matrix 24 may be a gel 26 suspending carbon-60 molecules 10 therein, each containing an ion. The medium 81 or surface 81 may be provided by any suitable method now in existence for electro-optical storage media. Since the head 30 and surface 81 may be manufactured at a fixed distance 79 with respect to one another, calibration and addressing need not be dynamic. As a practical matter, once all of the location 90 are determined according to a suitable mapping, or the like, a simple table may be relied upon for addressing all available memory. Additional calibration, alignment, and the like, associated with prior art devices, may be dispensed with.

To make a memory device, a head 30 may be manufactured. That the head 30 may be manufactured by creating carbon-60 molecules in an environment of ions or polarized molecules desired for creating, are fractive, virtual plane. The carbon-60 maybe formed in a crystal lattice. Carbon-60 is fabricated in the ion environment to produce crystalline carbon-60 cages 10 holding the desired ions interstitially therein, between the atoms 12 of the carbon-60 molecule 10. Conductive electrodes may be applied to an outer surface 28 of a head 30 Electrodes 34,36 need only have the head 30 therebetween. A memory medium may be placed in two dimensions to surround the head 30 at a distance 29.

A 2-dimensional surface 81 may be spherical, planar, cylindrical, or of any other shape suitable for being accurately addressed by a refracted light beam 52. The electrodes 82–88 may be energized to provide a phased, alternating field across each of the electrode pairs 72, 74, 76, 78, respectively in order to control a virtual plane of ions oscillating therein for performing the refraction of an incoming beam 48 of light.

The outgoing beam 52 directed by the head 30 may be used to write to various locations 90 on the surface 81. After writing to the medium 81, the head 30 may be controlled to orient the ions 20 to pass a reflected signal 68 back from the surface 81 and location 90 into the head 30 and back to the source 50 as a return beam 70. Just as radar provides for a sending and a receiving of a beam signal, an apparatus and method in accordance with the invention may effectively slice time, or multiplex the outgoing beam 52 with the return beam 68, in order to send and receive effectively simultaneously. The fields 82, 84, 86, 88 between pairs 72, 74, 76, 78 of electrodes respectively, may be energized in a phased relationship that will stabilize a virtual plane 59 as desired in order to obtain the rapid and precise refraction angle 69 desired in order to, write, or both, with the beam 48 to the surface 81 of a memory device 104.

From the above discussion, it will be appreciated that the present invention provides a solid state director for a light or other electromagnetic beam. A refractive angle is controlled by electric fields between multiple electrodes to create a virtual plane of captured ions in crystalline "cages" of Fullerene carbon-60. In accordance with semiconductor physics and optical physics of velocity drift, scanning rates over a 90 degree arc in elevation may be on the order of megahertz. The entire head 30, and storage medium 80, when combined into a memory device, provide a solid state device 104 requires no mechanical acceleration of parts larger than ions or captured molecules in a crystal lattice.

The memory device 104 increases in speed may approach three, four, five, or even six orders of magnitude over current technology known in the art. Density of such memory devices 104 may range from one order of magnitude improvement over conventional, prior art, memory devices, to three orders of magnitude over total three-dimensional envelopes of three-dimensional memory devices, such as holographic memory devices.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed and desired to be secured by United States Letters Patent is:

1. An apparatus for directing a beam of electromagnetic radiation, the apparatus comprising:
   a source for providing a beam of electromagnetic radiation; and
   a director that is spaced apart from the source, wherein the director comprises a plurality of carbon molecules that each include a captured polarized particle that is mobile therein, wherein the polarized particles are field actuatable to redirect the direction of the beam received from the source.

2. The apparatus of claim 1, wherein the director and source are configured in a solid state.

3. The apparatus of claim 1, wherein the director further comprises a matrix into which the carbon molecules are suspended.

4. The apparatus of claim 1, further comprising at least eight electrodes to produce electrical fields that are added vectorially together within the director to field actuate the polarized particles, and a target that is spaced apart from the director to receive the beam exiting the director.

5. The apparatus of claim 4, wherein the target is fixed with respect to the director.

6. The apparatus of claim 4, wherein the target is a workpiece irradiated by the beam.

7. A method for directing a beam, the method comprising:
   providing a carbon molecule matrix comprising carbon molecules which have captured within them polarized particles, wherein the polarized particles are movable within the carbon molecules;
   providing a beam impinging on a surface of the matrix;
   applying multiple fields to the matrix;
   directing the beam in two dimensions by refraction with respect to a plane of vibration of the polarized particles within each carbon molecule.

8. The method of claim 7, wherein the field is established by electrical potentials applied across opposing electrodes.

9. The method of claim 7, wherein the carbon molecules are Fullerene molecules.

10. The method of claim 7, wherein the matrix is shaped to enhance refraction of the beam therethrough.

11. A method for directing a beam, the method comprising:
    providing a director comprising a plurality of carbon molecules that each include a captured polarized particle that is moveable therein;
    impinging a beam onto a surface of the director; and
    applying a field to the director to move the polarized particles and change the direction of the beam such that the beam exits the director at a direction that is different than a direction of entry.

12. A method as in claim 11, wherein the field is established by applying an electrical potential across opposing electrodes.

13. A method as in claim 11, wherein the carbon molecules comprise Fullerene molecules.

14. A method as in claim 11, wherein the director includes a matrix material disposed about the carbon molecules, wherein the matrix material is shaped in the form of a hemisphere.

15. A method as in claim 11, further comprising applying multiple fields to the director to move the polarized particles in multiple planar directions such that the angle of incidence of the plane of polarized particles is altered thereby changing the direction of the beam.

16. A method as in claim 11, further comprising applying the fields to direct the beam onto a target that is spaced apart from the director.

* * * * *